United States Patent [19]

Johnson

[11] Patent Number: 4,564,756
[45] Date of Patent: Jan. 14, 1986

[54] PROXIMITY SENSOR WITH A LIGHT-EMITTING DIODE WHICH SIMULTANEOUSLY EMITS AND DETECTS LIGHT

[75] Inventor: Mark Johnson, Mt. Kisco, N.Y.

[73] Assignee: International Business Machines Corporation, Armonk, N.Y.

[21] Appl. No.: 568,667

[22] Filed: Jan. 6, 1984

[51] Int. Cl.$^4$ .............................................. G01D 5/34
[52] U.S. Cl. ............................. 250/231 SE; 250/206; 250/214 R; 250/221; 250/561
[58] Field of Search ............... 250/551, 552, 231 SE, 250/237 G, 221, 211 J, 206, 214 R, 231 R, 561; 357/19; 455/602, 606, 618

[56] References Cited

U.S. PATENT DOCUMENTS 4,286,171  8/1981  Hara et al. ........................... 250/551
4,417,140  11/1983  Adolfsson et al. ............... 250/231 R Primary Examiner—David C. Nelms
Attorney, Agent, or Firm—Ronald L. Drumheller

[57] ABSTRACT

An optical proximity detector of very small size and high resolution is provided by using a light emitting diode (LED) to illuminate a small detection region adjacent to the LED and by using the same LED simultaneously to sense light reflected from an object which enters the detection region. A circuit is provided which continuously forward biases a light emitting diode at a substantially constant bias current, thereby continuously illuminating a small region adjacent to the diode. When an object enters the illuminated region and reflects light back to the LED, it has been found that the impedance of the LED changes by a small amount. This small change in LED impedance and consequently the presence of a light reflecting object in the illuminated region is sensed by the circuit.

9 Claims, 4 Drawing Figures

U.S. Patent   Jan. 14, 1986   Sheet 1 of 2   4,564,756
FIG. 1
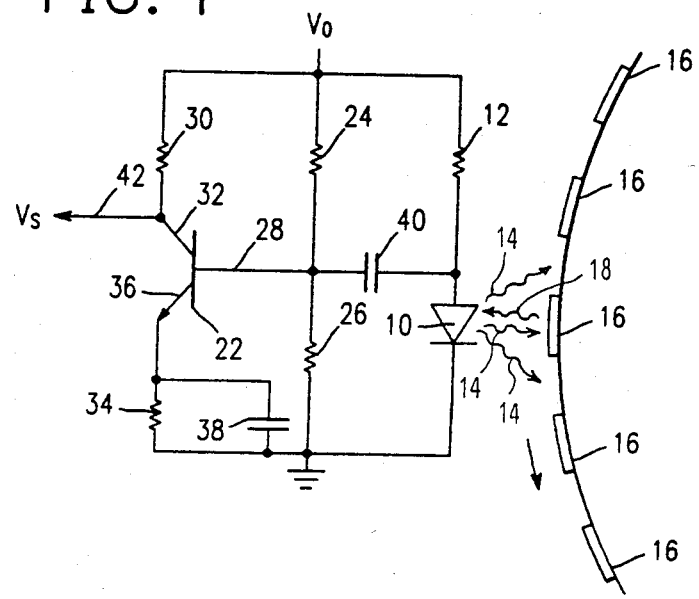
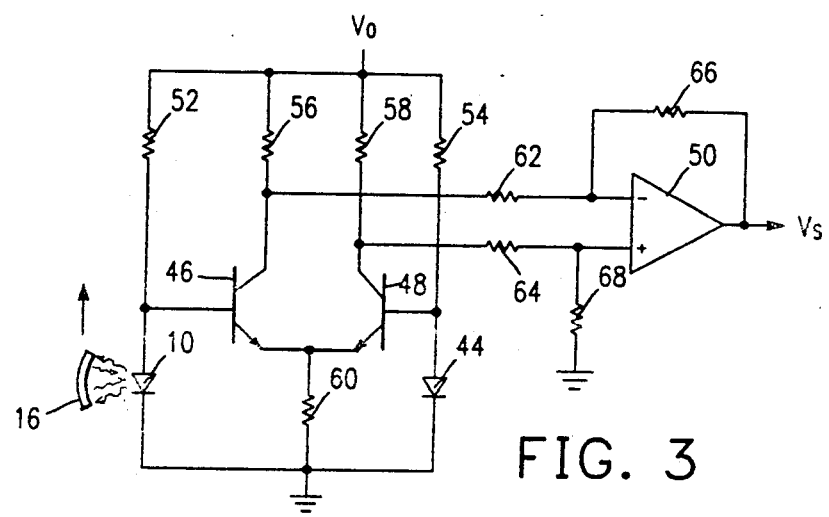
FIG. 3

PROXIMITY SENSOR WITH A LIGHT-EMITTING DIODE WHICH SIMULTANEOUSLY EMITS AND DETECTS LIGHT

DESCRIPTION

1. Technical Field

This invention relates to optical sensors and more particularly to a circuit which uses a single light-emitting diode (LED) simultaneously to both illuminate an object and to detect its own light reflected back from the object.

2. Background Art

Opto-electronic packages which both emit light and sense light are known in the prior art. However, most of the prior art opto-electronic packages which both emit and sense light actually contain separate opto-electronic devices for transmitting and detecting light. U.S. Pat. No. 3,697,762 describes a typical package of this type in which an LED emits light and a phototransistor detects returning light. A commercial package of this type is the Hewlett Packard HEDS-1000, for example, which consists of a red LED, a silicon photodiode and a bifurcated molded lens system. Packages of this type (particularly the ones which have a small spot size for high resolution sensing) are typically bulky and relatively expensive.

It is also known that laser light coupled back into the same laser will affect its lasing action. This effect is relied upon to sense an optical fiber discontinuity, for example, in U.S. Pat. No. 4,243,320 and German Offenlegungsschrift No. 2852614. However, lasers are very sensitive to the phase of the returning light in relation to the phase of the light being emitted by the laser. Accordingly, while a self-detecting laser configuration can be used in an interferometric type of sensing application, a laser is not well suited for use as a proximity sensor where the distance to the sensed object is not known and furthermore varies.

LED circuit arrangements are also known in the prior art wherein the same LED is used to both emit and sense light. Typical of such circuits are the circuits described in U.S. Pat. Nos. 4,168,427 and 4,317,232 and in an article by F. Mims entitled "Communicate over Light Beams with the First Single-LED Transceiver," Popular Electronics, pp. 66–70 (March 1973). However, all of the known circuits of this type switch the LED between a receive mode and a transmit mode. Accordingly, the single LED used in such applications is never used to simultaneously transmit light and detect light. As a result, such prior art LED circuit arrangements are all unsuitable for use in a proximity sensing application where simultaneous light emission and light sensing is required.

It is an object of this invention to improve the spatial resolution achieved by an optical proximity sensor.

It is also an object to reduce the physical size of an opto-electronic light source and light detector combination.

A further object of this invention is to reduce the cost and complexity of an optical proximity sensor.

Still another object is to use an LED as both a light source and a light detector simultaneously.

DISCLOSURE OF THE INVENTION

An optical proximity detector of very small size and high resolution is provided by using a light emitting diode (LED) to illuminate a small detection region adjacent to the LED and by using the same LED simultaneously to sense light reflected from an object which enters the detection region. A circuit is provided which continuously forward biases a light emitting diode at a substantially constant bias current, thereby continuously illuminating a small region adjacent to the diode. When an object enters the illuminated region and reflects light back to the LED, it has been found that the impedance of the LED changes by a small amount. This small change in LED impedance and consequently the presence of a light reflecting object in the illuminated region is sensed by the circuit.

BRIEF DESCRIPTION OF THE DRAWINGS

FIG. 1 schematically illustrates an optical proximity sensor arrangement in accordance with this invention wherein the detection circuitry is A.C. coupled to the LED.

FIG. 3 schematically illustrates another optical proximity sensor arrangement in accordance with this invention wherein the detection circuitry is directly coupled to the LED.

DESCRIPTION OF THE PREFERRED EMBODIMENT

Figure 2:
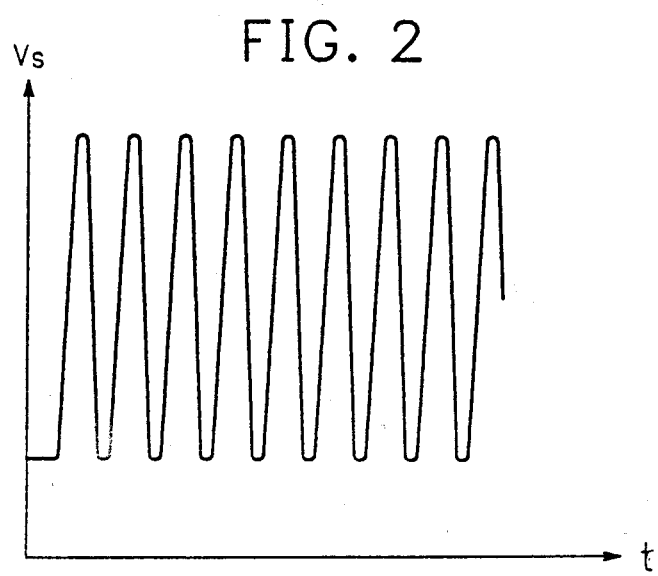
FIG. 2 shows the output signal produced by the arrangement of FIG. 1.

In accordance with this invention, a more compact, less complicated, less expensive and higher resolution proximity detector is formed by using a single LED simultaneously as both the light source and the light detector in an optical proximity sensing arrangement. Since an LED emits light only when it is forward biased, simultaneous operation of a single LED as both a light emitter and a light detector requires that light detection by the LED be done while the LED is forward biased. This is believed to be a new mode of operation for an LED. It has been discovered, furthermore, that a conventional preamplifier designed to sense high impedance sources cannot be used directly to detect the impedance variation of a forward biased LED caused by the LED response to returning light. A forward biased LED has such a low impedance that a small variation in the voltage across the LED or a small variation in the current flowing through the LED cannot be observed in the presence of noise which is also simultaneously detected unless the preamplifier either has been designed specifically to sense low impedance sources or an impedance matching device such as a transformer is interposed.

In accordance with this invention, an LED is continuously forward biased at substantially the same constant bias point and variations are sensed in the LED impedance caused by the LED response to reflected light. This may be done in theory either by driving a constant current through the LED and sensing variations in the voltage across the LED or by holding a constant voltage across the LED and sensing variations in the current flowing through the LED.

FIG. 1 schematically shows a preferred circuit arrangement in which a voltage signal across a forward biased LED caused by the LED response to returning light is detected by a common emitter amplifier. LED 10 is a TIL40 series diffused GaAs LED, which is forward biased by supply voltage $V_o$ and resistance 12 such that a constant current of about 10mA flows through the LED, causing the LED 10 to emit about 450 microwatts of infrared light at about 940nm wavelength. The emitted light 14 illuminates a region adjacent to LED 10. If an object 16 is in the illuminated region, some of the LED light will strike object 16 as shown. When an object 16 is positioned suitably adjacent to LED 10, reflected light 18 returns to the LED 10 and the presence of an object 16 adjacent to LED 10 will be detected from the impedance change of LED 10 caused by the returned light.

In the FIG. 1 illustration, object 16 is shown as one of many reflective spots on a rotating drum 20. Drum 20 could be the drive drum of a band printer, for example. It is preferred that in an application such as is shown, the reflective spots be formed by applying retroreflector material to the drum everywhere that reflection is desired. "Scotchlite" brand retroreflecting tape may be used, for example, and is sold by the 3M Company. The use of a retroreflective surface rather than a conventional reflective surface is preferred because a retroreflective surface reflects light back along the same direction from which the light came, thereby returning a relatively large percentage of the incident light to the LED over a wide view angle. It should be understood, however, that in theory any type of light reflective or light scattering surface, whether planar or non-planar, may be sensed in accordance with this invention. By way of illustration, FIG. 3 shows an object 16 having the form of a concave mirror.

Transistor 22 is connected in common emitter configuration to detect and amplify the voltage across LED 10. Resistances 24, 26 are connected between base 28 of transistor 22 and supply voltage $V_o$ and ground respectively to bias base 28 of transistor 22. Load resistance 30 is connected between collector 32 of transistor 22 and supply voltage $V_o$ while emitter biasing resistance 34 is connected between emitter 36 of transistor 22 and ground. Capacitance 38 connected between emitter 36 and ground effectively grounds the emitter at signal frequencies in order to reduce total noise. Capacitance 40 provides A.C. coupling between LED 10 and transistor 22. A.C. coupling is preferred when the signals to be sensed have a sufficiently high frequency that the value of capacitance 40 (and also capacitance 38) required to pass those frequencies is not too burdensome. A.C. coupling has the advantage that low frequency thermally induced signals are blocked from detection and the biasing of transistor 22 is greatly simplified.

The signal output voltage $V_s$ of common emitter amplifier 22 is available from line 42. FIG. 2 illustrates in graphical form the output waveform observed on line 42 when the LED 10 is exposed to reflected light which is alternately present and not present, such as might occur, for example, when a drum having retroreflecting stripes, such as shown in FIG. 1, is rotated in front of and in close proximity to LED 10.

FIG. 3 illustrates another self-detecting LED proximity sensor in which the detection circuitry has a balanced configuration so that direct coupling from the LED can be used. When direct coupling is used, it is important that some provision be made for removing thermally induced signals, since thermally induced signals can have an amplitude much larger than the signals caused by impedance variation resulting from self-detection of light. In FIG. 3, two matched LEDs 10 and 44 are used. LED 10 responds to reflected light 18 from object 16, while LED 44 compensates for thermal changes. LEDs 10 and 44 not only should be as identical as possible but they also should be exposed to exactly the same environmental conditions except for the reflected light. As a result LEDs 10 and 44 are preferably formed together on the same chip and preferably remain even in physically contact with each other so long as LED 44 is shielded from any reflected light arising from either LED or elsewhere. Matched transistors 46 and 48 are directly coupled to LEDs 10 and 44 respectively in a differential configuration. Operational amplifier 50 senses the difference between the output voltage of transistor 46 and the output voltage of transistor 48 to produce an output voltage $V_s$ which reflects only the signal portion arising from the reflected light induced variation in the LED 10 impedance. Any signal arising from thermal variations theoretically occurs in both LEDs and is amplified equally by both transistors only to cancel each other at the differential input to operational amplifier 50.

The circuit shown in FIG. 3 may be constructed, for example, by using for transistors 46 and 48 an LM394 supermatched pair of transistors sold by National Semiconductor Co. For the circuit illustrated, $V_o$ might be 24 volts, for example, and suitable resistance values might be, for example: 2.2K for resistances 52, 54; 20K for resistances 56, 58; 250 ohms for resistance 60; 3K for resistances 62, 64; and 300K for resistances 66, 68. For the circuit in FIG. 1, $V_o$ also might be 24 volts, for example, and suitable resistance values might be, for example: 2.2K for resistance 12; 100K for resistance 24; 10K for resistance 26; 20K for resistance 30, 1.4K for resistance 34; and 1,000 microfarads for capacitances 38 and 40.

Figure 4:
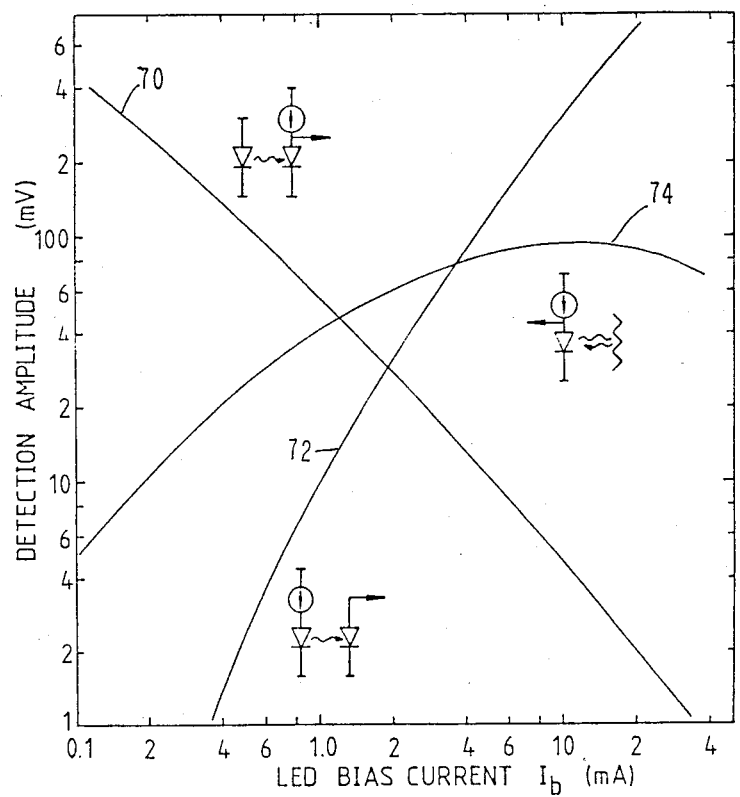
FIG. 4 graphically illustrates how an optimum bias point is chosen for a self-detecting LED arrangement.

FIG. 4 illustrates how an optimum bias point for the LED might be determined. Line 70 shows the amplitude of the detected signal as a function of the LED bias current when the returning light has a predetermined amplitude which does not change. In practice another LED acts as the light emitter and is placed next to the detecting LED. This is done so that a curve 70 may be produced which is not dependent upon the amplitude of the light emission. Line 72 shows the amplitude of the emitted light as a function of LED bias current. In practice two LEDs are again used to form this curve, the one LED acting to emit the light and having its bias current change and the other having a constant bias current and acting to measure the amplitude of the emitted light. Line 74 shows the detected light amplitude when a single LED is used to both emit the light and to detect its own reflected light as a function of bias current. As shown by the curves, light detection sensitivity increases as the forward bias current decreases (curve 70). On the other hand, the LED light emission amplitude increases as the bias current increases (curve 72). Curve 74 shows the overall result of combining curves 70 and 72 as occurs when the same bias current is used for both the light emission and the light detection by the same LED. The optimum bias point corresponds to the point where the curve is at a maximum, which in the case of the LED curves shown is at about 10 mA.

In addition to proper selection of the bias point for the LED, it is important in order to reduce circuit noise to select for at least the first transistor amplification stage a transistor with a low base spreading resistance. It is also important in order to reduce circuit noise for at least the first transistor amplifier stage to be operated at a high collector current. It has been found that the transistor model 2SD786 from Toyo Electronics Ind. Corp. has a suitably low base spreading resistance and can be operated advantageously at about 1 mA bias current.

Having thus described my invention, what I claim as new and desire to secure by Letters Patent is:

1. A self-detecting light-emitting diode proximity sensor, comprising:

a light emitting diode;

means forward biasing said diode at a substantially constant forward bias thereby illuminating a detection region adjacent said light emitting diode with light emitted from said diode, some of the light emitted by said diode reflecting back and illuminating said forward biased diode when an object to be sensed is within said detection region; and signal amplifying means connected to said light emitting diode for sensing variations in the impedance of said forward biased diode caused by reflected light illuminating said diode, whereby the presence of an object within said detection region is thereby sensed.

2. A self-detecting light-emitting diode proximity sensor as defined in claim 1 wherein said light emitting diode is forward biased at a substantially constant forward bias current and said signal amplifying means senses variations in the voltage across said forward biased light emitting diode.

3. A self-detecting light-emitting diode proximity sensor as defined in claim 2 wherein said amplifying means comprises a transistor connected in a common emitter configuration.

4. A self-detecting light-emitting diode proximity sensor as defined in claim 3 wherein said transistor is connected to said light emitting diode through a coupling capacitance.

5. A self-detecting light-emitting diode proximity sensor as defined in claim 3 wherein said transistor is directly connected to said light emitting diode.

6. A self-detecting light-emitting diode proximity sensor as defined in claim 1 wherein said object to be sensed has a retroreflective surface.

7. A self-detecting light-emitting diode proximity sensor as defined in claim 1 wherein said object has a reflective surface.

8. A self-detecting light-emitting diode proximity sensor as defined in claim 1 wherein said light emitting diode is a diffused GaAs light emitting diode.

9. A self-detecting light-emitting diode proximity sensor as defined in claim 1 wherein said light emitting diode emits infrared light.

* * * * *